United States Patent [19]

Shafer

[11] Patent Number: 5,410,434
[45] Date of Patent: Apr. 25, 1995

[54] REFLECTIVE PROJECTION SYSTEM COMPRISING FOUR SPHERICAL MIRRORS

[75] Inventor: David R. Shafer, Fairfield, Conn.

[73] Assignee: Ultratech Stepper, Inc., San Jose, Calif.

[21] Appl. No.: 118,303

[22] Filed: Sep. 9, 1993

[51] Int. Cl.⁶ .............................................. G02B 5/08
[52] U.S. Cl. ................................. 359/858; 359/838; 359/839; 359/857; 359/859
[58] Field of Search ............... 359/838, 839, 840, 850, 359/858, 859, 857; 372/57; 378/34, 35

[56] References Cited

U.S. PATENT DOCUMENTS

| | | | |
|---|---|---|---|
| 4,812,028 | 3/1989 | Matsumoto | 359/859 X |
| 5,004,331 | 4/1991 | Haseltine et al. | 359/858 X |
| 5,078,502 | 1/1992 | Cook | 359/859 X |
| 5,144,476 | 9/1992 | Kebo | 359/859 X |
| 5,153,898 | 10/1992 | Suzuki et al. | 378/34 |
| 5,212,588 | 5/1993 | Viswanathan et al. | 359/859 X |
| 5,227,923 | 7/1993 | Kebo | 359/859 |
| 5,253,117 | 10/1993 | Kashima | 359/859 |
| 5,257,139 | 10/1993 | Higuchi | 359/859 |
| 5,287,218 | 2/1994 | Chen | 359/858 X |
| 5,291,340 | 3/1994 | Kashima | 359/859 X |

Primary Examiner—Brian Healy
Attorney, Agent, or Firm—Allston L. Jones

[57] ABSTRACT

The reflective projection system has a relatively wide field of view that comprises two concave and two convex spherical mirrors, situated in certain non-light-blocking positions with respect to one another, for deriving, with negligible image aberrations, a projected magnified or demagnified image over at least one of a range of magnification or demagnification power values between 3 and infinity that may be zoomed over this range. Such a reflective projection system, utilizing a high-power excimer laser radiation source, may be employed for ablating the surface of a substrate, such as the surface of the coating of a coated wafer, with a demagnified image of an object pattern defined by a mask, the radiation intensity of the demagnified image being sufficiently high to effect this ablation.

14 Claims, 5 Drawing Sheets

REFLECTIVE PROJECTION SYSTEM COMPRISING FOUR SPHERICAL MIRRORS

BACKGROUND OF THE INVENTION

1. Field of the Invention

A magnification-demagnification optical system and, more particularly, to such an optical system suitable for projecting a high-power-density beam of radiation manifesting a demagnified precise image of a given mask or reticle pattern on an ablation surface of a substrate, such as the surface of a coated semiconductor, for the purpose of ablating the ablation surface in accordance with the pattern image.

2. Description of the Prior Art

Both transmissive (lens) element and reflective (mirror) element systems for deriving a projected light image are known in the art. In the design of such systems, it is usually desired to reduce image aberrations to a minimum or, at least, to an acceptable level within complexity and cost constraints. It is not practical to attempt to solve the large number of non-linear ray-tracing equations of design variables that it usually takes to determine exact element positions for the design that introduces the minimum image aberrations. Therefore, in practice, simplifications are made that permit "starting points" for the element positions that are only somewhere in a general vicinity of the exact element positions to be determined. After which, known iterative computer software programs are employed for moving the element positions from their respective "starting points" toward their respective exact positions at which optical aberrations are reduced toward a minimum and a specified magnification or demagnification is obtained. Examples of such computer software programs are "Code V", available from Optical Research Associates, 550 North Rosemead Boulevard, Pasadena, Calif. 91107, and "Super Oslo", available from Sinclair Optics, 6780 Palmyra Road, Fairport, N.Y. 14450. In principle, the optimization of the optical design performed by such computer software programs could be performed analytically instead. However, because the analytical way of performing optical design is very tedious and time consuming, it is significantly less practical than optical design performed by computer software programs.

As known in the art, transmissive projection optics employing a system of one or more lenses is commonly used for most imaging purposes. A lens system has several design variables available (e.g., lens shape, lens power, lens separation and lens material) that can be used to control the many image aberrations that must be optimized for good performance. However, transmissive projection optics are not suitable for implementing the aforesaid surface ablation because absorption of heat by one or more of the lenses of such transmissive projection optics due to a high power-density beam of radiation passing therethrough is at least sufficient to degrade the image quality and may be sufficient to destroy a lens. By way of example, consider the case in which a beam of ultraviolet radiation from a high-power excimer laser (e.g., at least 100 watts) having a wavelength of 0.24840 micrometer ($\mu$m), after passing through a mask defining a given pattern, is demagnified at its image plane by a factor of 5 in each of its two cross sectional dimensions. The result is that the demagnified beam in the image plane has a power density of $5^2$ or 25 times higher than the already high power density that the beam had in passing through the mask. The very high power density of the demagnified beam in the image plane is needed to effect the the aforesaid surface ablation. Other useful ultraviolet radiation wavelengths of a high-power excimer laser are 0.308 $\mu$m and 0.196 $\mu$m.

A mirror absorbs very little of the radiation energy incident thereon. Therefore, reflective projection optics employing only a system of mirrors would be suitable for implementing the aforesaid surface ablation. However, the physical presence of one mirror of a multi-mirror system tends to get in the way of the light path to another mirror of the system, and thereby obscures or vignettes parts of the light beam. This makes it particularly difficult to implement reflective projection optics employing a relatively large number of mirrors to transmit a large field of view without serious energy loss due to mirror blockage of the light path. Further, since a mirror has fewer degrees of design freedom than a lens, in order to obtain a sufficient number of design variables to overcome image aberrations, it takes a large number of mirrors or the use of aspheric surfaces to achieve the the same number of design variables that even a simple lens system possesses. Since the light blockage problem is compounded as the number of mirrors required to reduce image aberrations to a negligible level becomes greater, fewer mirrors having aspheric surfaces are normally employed in reflective projection optics to obtain sufficient design variables. Because aspheric surfaces are much more difficult and expensive to make than are spheric surfaces, a reflective projection system employing only spheric mirror surfaces that introduce only negligible optical aberrations would be most desirable for a purpose such as ablating a surface in accordance with a projected demagnified pattern image.

SUMMARY OF THE INVENTION

The present invention is directed to a reflective projection system having a relatively wide field of view that comprises four spherical mirrors, situated in certain non-light-blocking positions with respect to one another, for deriving, with negligible image aberrations, a projected magnified or demagnified image over at least one of a range of magnification or demagnification power values.

More specifically, the present invention is directed to a reflective projection system having a given optical axis for either projecting, into a portion of an annular ring surrounding the given optical axis and lying in a first plane, a demagnified radiation image of an object pattern situated in a second plane or, alternatively, projecting, into the second plane, a magnified radiation image of an object pattern situated in the portion of an annular ring.

The reflective projection system comprises (1) a first spherical-mirror segment of a certain width having a concave surface radius of curvature equal in value to $R_1$, the first spherical-mirror segment being spaced a first given axial distance $T_0$ from the first given plane; (2) a second spherical-mirror segment of a certain width having a convex surface radius of curvature equal in value to $R_2$, the second spherical-mirror segment being spaced a second given axial distance $T_1$ from the first spherical-mirror segment; (3) a third spherical-mirror segment of a certain width having a concave surface radius of curvature equal in value to $R_3$, the third spherical-mirror segment being spaced a third given axial distance $T_2$ from the second spherical-mirror segment; and (4) a fourth spherical-mirror segment of a certain width having a convex surface radius of curvature equal in value to $R_4$, the fourth spherical-mirror segment being spaced a fourth given axial distance $T_3$ from the third spherical-mirror segment.

The relative values of the respective radii of curvatures $R_1$, $R_2$, $R_3$ and $R_4$ are such that $R_2 \leq R_1 \leq R_3 \leq R_4$ and $0.85 \leq (1/R_1 + 1/R_3)/(1/R_2 + 1/R_4) \leq 1.15$; the annular ring has a radius no greater in value than 0.2; and the respective lengths of axial distances $T_0$, $T_1$, $T_2$ and $T_3$, the respective spatial positions of the first, second, third and fourth spherical-mirror segments, and the respective certain widths of the first, second, third and fourth spherical-mirror segments are such that radiation defining an object pattern situated in the second plane is successively reflected, in order, from the fourth, third, second and first spherical-mirror segments defines an optimized image of the object pattern with a numerical aperture no greater than 0.12 in the first plane with a Strehl ratio of total aberrations at least equal in value to 0.95 which is demagnified by a specified demagnification power value between 3 and infinity, with the second and first spherical-mirror segments by themselves providing a demagnification or magnification power value between 0.8 and 1.2, and with substantially no blockage of the reflected radiation traveling over a path between the first and second planes taking place by the presence an intervening one of the spherical-mirror segments in the radiation path.

DETAILED DESCRIPTION OF PREFERRED EMBODIMENT

Figure 1:
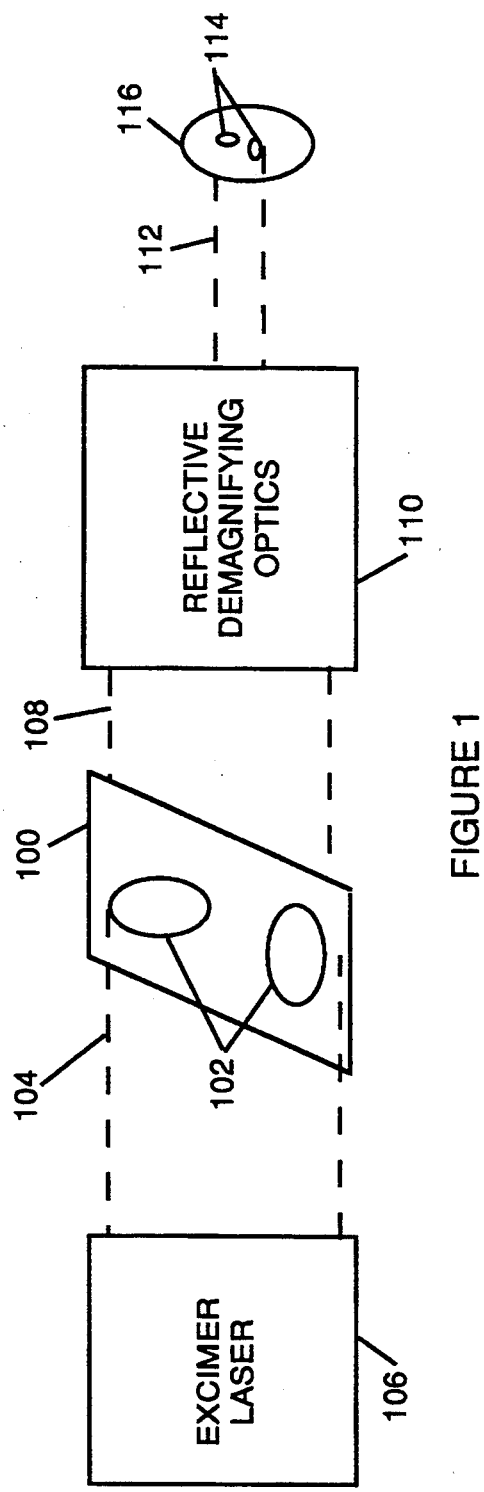
FIG. 1 is a functional diagram schematically showing an illustrative example of a reflective projection system incorporating the present invention.

Referring to FIG. 1, there is functionally shown an optical projection system comprising mask 100 that defines transparent object pattern 102. Mask 100 is illuminated by illuminating beam 104 of ultraviolet light emitted from excimer laser 106. Emerging from mask 100 is pattern-information object beam 108 that is applied as an input to reflective demagnifying optics 110. The output from reflective demagnifying optics 110 is pattern-information image beam 112. Pattern-information image beam 112 focuses image pattern 114 on ablation surface 116 of a substrate, which may comprise the surface of a wafer coating for example, for the purpose of ablating a portion of ablation surface 116 in accordance with focused image pattern 114 incident thereon.

As indicated in FIG. 1, image pattern 114 is a replica of object pattern 102 having substantially reduced cross sectional dimensions in accordance with the particular value of the demagnification power of reflective demagnifying optics 110. Solely for illustrative purposes in describing the present invention, it is assumed that the particular value of the demagnification power of reflective demagnifying optics 110 is 5, so that the power density of pattern-information image beam 112 focused on ablation surface 116 is 25 times as great as the power density of pattern-information object beam 102. It is further assumed that this increased power density of pattern-information image beam 112 is sufficient to ablate the ablation surface 116 in accordance with image pattern 114.

As known, an optical system for projecting an image pattern of an object pattern, and particularly a reflective projection system employing spherical mirrors, inherently introduces some finite amount of unwanted aberrations (i.e., spherical aberration, coma, astigmatism, Petzval curvature and distortion) in the projected image pattern. As known in the art, a measure of the total aberrations in an imaging system is the so-called Strehl Ratio, which approaches unity as the value of the total aberrations approach zero (so that only an unattainable complete absence of aberrations would result in a Strehl Ratio equal to 1). For the purposes of accurately performing the ablation function illustrated in FIG. 1, the Strehl ratio of reflective demagnifying optics 110 should have a quantitative value of at least 0.95 (that is qualitatively the total aberrations introduced by optics 110 should be negligible). The embodiment of reflective demagnifying optics shown in FIGS. 2, 3 and 4, which employs only four spherical mirrors for imaging purposes, meets this criterion.

Figure 1A:
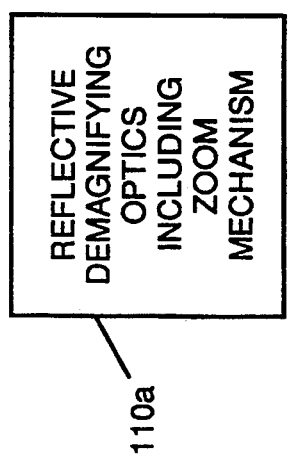
FIG. 1a is a block diagram illustrating an alternative embodiment of the reflective demagnifying optics of FIG. 1 which includes a zoom mechanism capable of varying the demagnification provided by the reflective demagnifying optics over a continuous range of demagnification power values.

FIG. 1a illustrates an alternative embodiment 110a of reflective demagnifying optics 110 of FIG. 1 which includes a known mechanism for providing the demagnifying optics with a zoom capability for varying the demagnification provided by the reflective demagnifying optics over a continuous range of demagnification power values. The beneficial operation of such a zoom capability in connection with the reflective projection system of the present invention will be discussed in more detail below.

Figure 2:
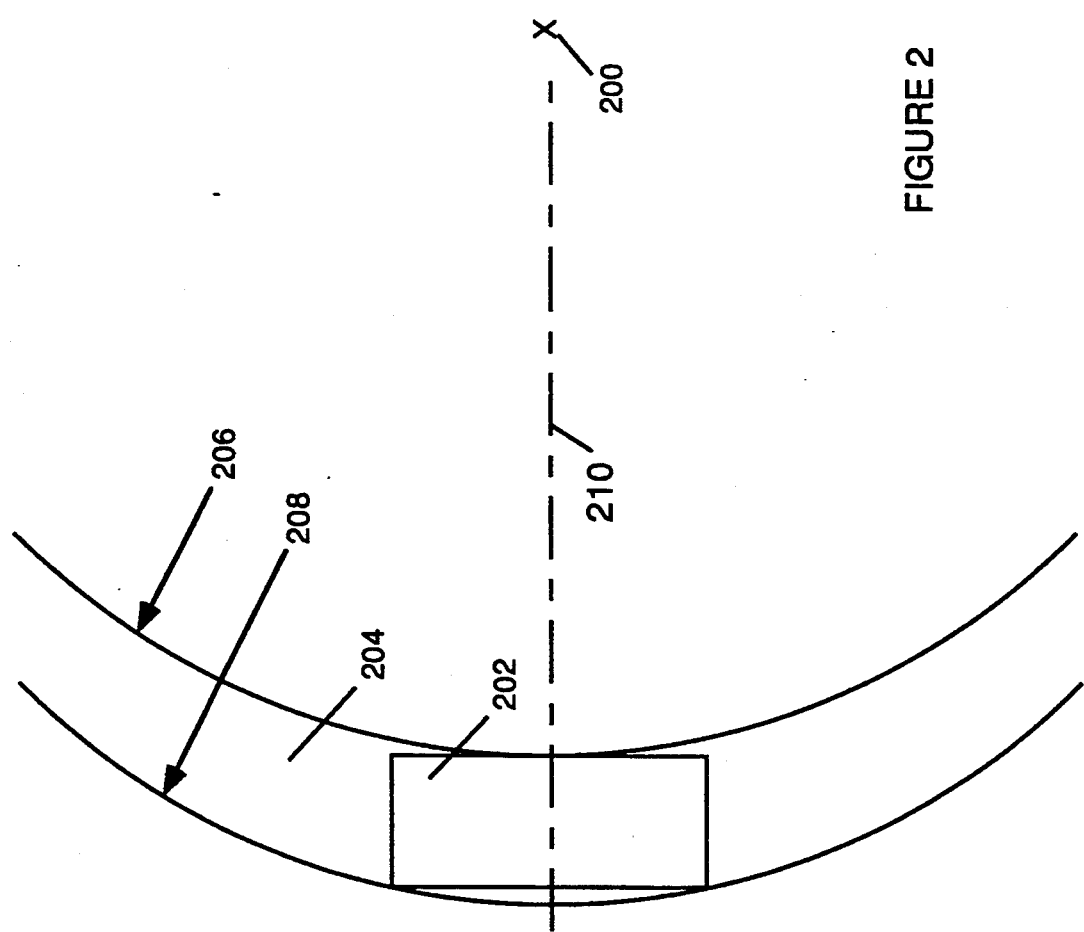
FIG. 2 diagrammatically illustrates an annular ring field employed by the reflective projection system of FIG. 1.

Referring first to FIG. 2, axis 200 of the reflective projection system of the reflective projection system shown in FIG. 3, described below, is oriented perpendicular to the image plane (i.e., the plane of the paper) and passes therethrough at point "X". Ablation zone 202 lies in the image plane within annular ring field 204 defined by an inner radius 206 and an outer radius 208 both of which are centered on axis 200. The result, as shown by line 210 in FIG. 2, is that ablation zone 202 is horizontally offset from axis 200. By way of a practical example, inner radius 206 of annular ring field 204 may be 40.0 millimeters (mm), outer radius 208 of annular ring field 204 may be 46.0 mm, the width of ablation zone 202 may be 5.4 mm and the length of ablation zone 202 may be 15.0 mm.

Figure 3:
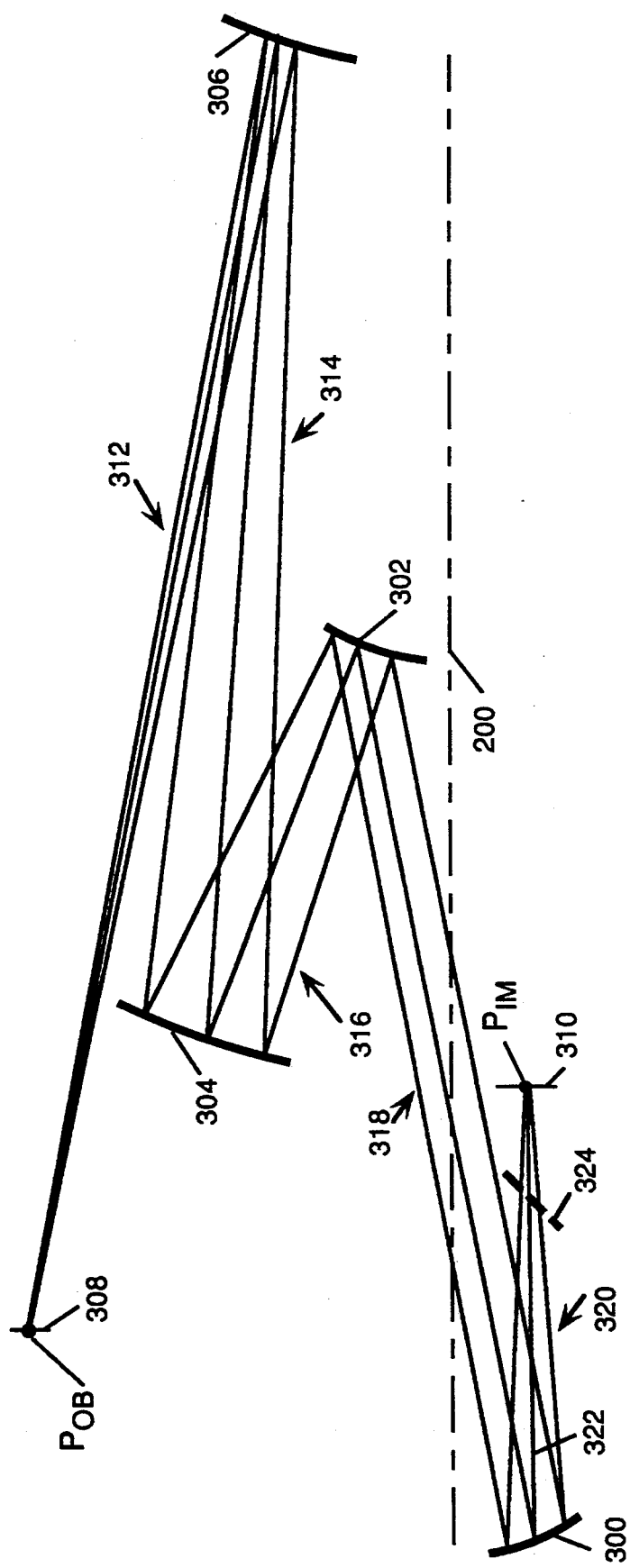
FIG. 3 diagrammatically illustrates an embodiment of the reflective projection system of the present invention that incorporates only four spherical-mirror segments, two of which have concave surfaces and two of which have convex surfaces, together with an optional single fold mirror.

Referring now to FIG. 3, there is shown (with thick lines) the physical positions of concave spherical-mirror segment 300, convex spherical-mirror segment 302, concave spherical-mirror segment 304, and convex spherical-mirror segment 306. Also shown is the light path from point $P_{OB}$ of object plane 308 to point $P_{IM}$ of image plane 310. This light path includes a first segment 312 extending from point $P_{OB}$ to the surface of convex spherical-mirror segment 306, a second segment 314 reflected from the surface of convex spherical-mirror segment 306 which is incident on the surface of concave spherical-mirror segment 304, a third segment 316 reflected from the surface of concave spherical-mirror segment 304 which is incident on the surface of convex spherical-mirror segment 302, a fourth segment 318 reflected from the surface of convex spherical-mirror segment 302 which is incident on the surface of concave spherical-mirror segment 300, and a fifth segment 320 reflected from the surface of concave spherical-mirror segment 300 which extends to point $P_{IM}$. As indicated in FIG. 3, image point $P_{IM}$ is offset from optical axis 200 (i.e., lies inside of ablation zone 202 that is situated within annular ring field 204. as shown in FIG. 2). Further, image point $P_{IM}$ is telecentric with optical axis 200 (i.e., central ray 322 of light path 320 is oriented substantially parallel to optical axis 200). Optionally, there may be situated in the light path one or more fold mirrors, such as fold mirror 324 situated in light path 320 (schematically shown by a dashed line in FIG. 3). If present, fold mirror 324 would serve the sole purpose (should such a purpose be desirable in any given case) of rotating the position of image plane 310 by 90° so as to lie in a horizontal plane above (or, alternatively, below) the plane of the paper. Specifically, fold mirror 324 is actually angularly oriented to reflect incident light 320 into a vertical plane (i.e., in a plane normal to the horizontal plane of the FIG. 3 paper). However, because it is not possible in the horizontal plane of the FIG. 3 paper to clearly show the actual angular orientation of fold mirror 324, the angular orientation of the dashed line representing fold mirror 324 in FIG. 3 is only meant to schematically indicate the actual angular orientation of fold mirror 324. Each of the spherical surfaces of respective mirror segments 300, 302, 304 and 306 is centered on optical axis 200, as is more clearly shown in FIG. 4.

Figure 4:
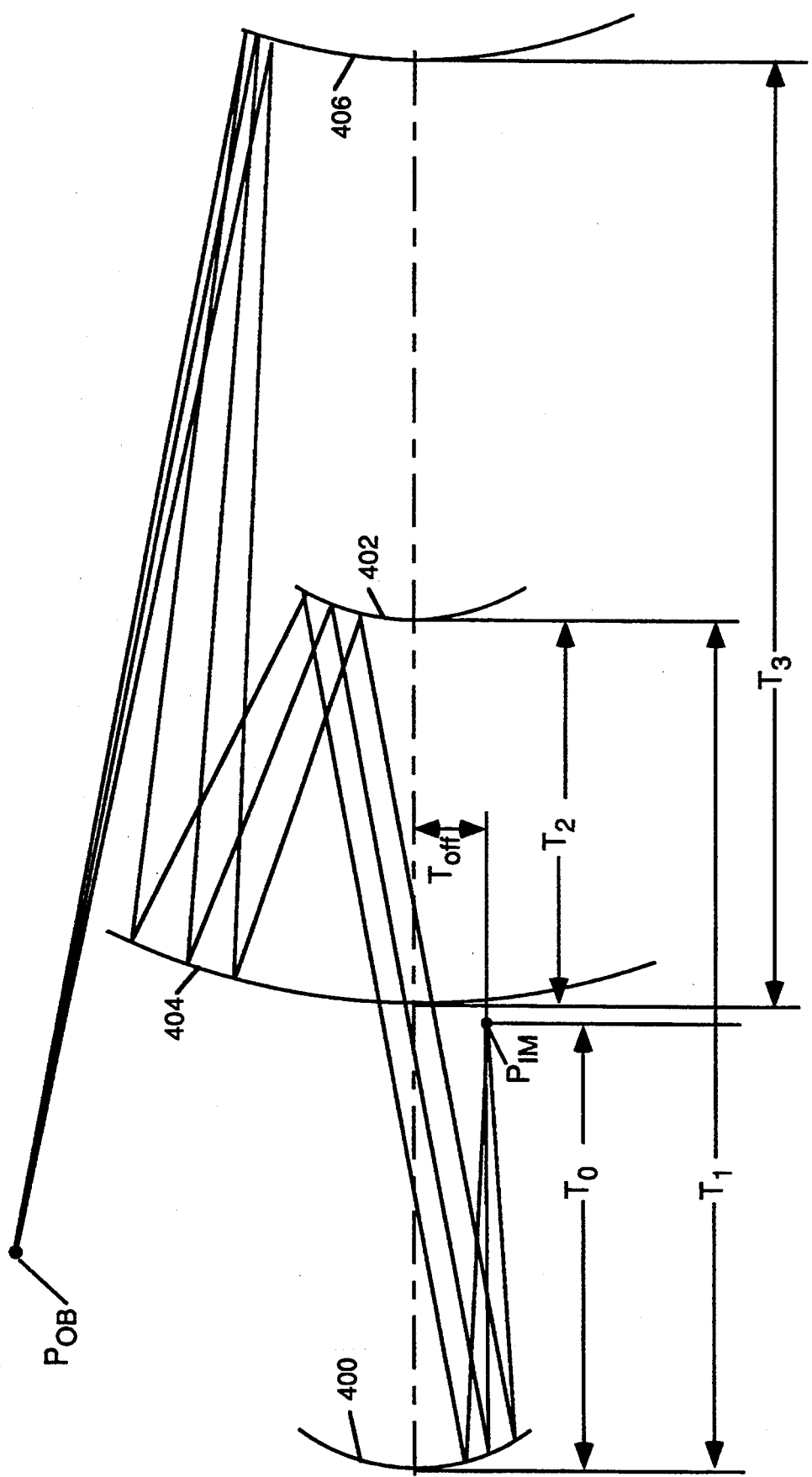
FIG. 4 diagrammatically indicates the spatial relationships of the concave and convex surfaces of FIG. 3 with respect to one another and with respect to the optical axis of the reflective projection system.

FIG. 4, which is not physical in nature, is merely meant to diagrammatically indicate the respective geometric relationships among the extended spherical surfaces 400, 402, 404 and 406 corresponding to the four physical mirror segments shown in FIG. 3 and the object and image points $P_{OB}$ and $P_{IM}$. Specifically, the distance parallel to optic axis 200 between image point $P_{IM}$ and surface 400 is $T_0$, the distance parallel to optic axis 200 between surface 400 and surface 402 is $T_1$, the distance parallel to optic axis 200 between surface 402 and surface 404 is $T_2$, and the distance parallel to optic axis 200 between surface 404 and surface 406 is $T_3$. Further, The radius of curvature of surface 400 is $R_1$, the radius of curvature of surface 402 is $R_2$, the radius of curvature of surface 404 is $R_3$, and the radius of curvature of surface 400 is $R_4$.

Given that ablation zone 202 (within annular ring field 204) of FIG. 2 lies in an image plane that includes point $P_{IM}$ (so that point $P_{IM}$ is offset by distance $T_{off}$ from optical axis 200, where distance $T_{off}$ has a value between that of inner diameter 206 and that of outer diameter 208) the optical design problems are (1) to choose values for respective radii curvature of $R_1$, $R_2$, $R_3$ and $R_4$ and values for respective distances $T_0$, $T_1$, $T_2$, $T_3$ and $T_{off}$ that defines the position of an object plane 308 including point $P_{OB}$ that results in a specified demagnification of the size of the image with respect to that of the object and provides a focused image with negligible total aberrations; and (2) to choose the respective sizes and positions of the physical spherical-mirror segments 300, 302, 304 and 306 of FIG. 3 so that none of these segments results in any significant blockage of light in the path between the object and image.

As known, the ray equations which provide solutions for a reflective imaging system comprising a relatively large number of mirrors (e.g., 4 spherical mirrors) are quite complex and non-linear. However, if "starting-point" values for respective radii $R_1$, $R_2$, $R_3$ and $R_4$ and respective distances $T_0$, $T_1$, $T_2$, and $T_3$ anywhere in a specified general vicinity of the desired optimum values thereof are defined, iterative computer software programs, such as those discussed above, may be employed for moving the element positions from their respective "starting points" toward their respective exact positions at which optical aberrations are reduced toward a minimum and a specified magnification or demagnification is obtained. On the other hand, because of the non-linearity of the ray equations, an attempt to employ such an iterative computer software program from "starting-point" values that fall outside of the specified general vicinity of the desired optimum values will result in failure. In accordance with the following teachings of the present invention, "starting-point" boundary values are defined that are within the general vicinity of the desired optimum values for the case of a projection system comprising four spherical mirrors for a general case in which the demagnification value selected by the iterative computer software program is chosen to have any particular value between 3 and infinity (infinity occurring when light path 312 consists of substantially parallel light rays):

Boundary-Condition Relationships:
 1. Numerical Aperture (N.A.) of light path 320 from spherical-mirror segment 300 to image point $P_{IM}$: N.A. $\leq 0.12$
 2. $T_{off}/R_1 \leq 0.2$
 3. $R_2 \leq R_1 \leq R_3 \leq R_4$ and $0.85 \leq (1/R_1 + 1/R_3)/(1/R_2 + 1/R_4) \leq 1.15$
 4. $0.4 \leq T_0/R_1 \leq 0.7$
 5. $0.6 \leq T_1/R_1 \leq 1.1$
 6. $0.4 \leq T_2/R_2 \leq 85$
 7. $0.5 \leq T_3/R_3 \leq 1.2$ By first employing "starting-point" boundary values in conformity with boundary-condition relationships 1–7, and then optimizing the optical design in accordance with a computer software program, such as one of the aforesaid software programs, results in the rays of optical path 318 reflected from the convex surface of spherical-mirror segment 302, which are directed to the concave surface of spherical-mirror segment 300, being at least approximately collimated. Further, a virtual image of the object pattern is derived the convex surface of spherical-mirror segment 302 and the demagnification-magnification produced by spherical-mirror segments 300 and 302 is in a range that is equal to or greater than 0.8 and is equal to or smaller than 1.2. After being optimized by the computer software program, the final spatial positions of spherical-mirror segments 300, 302, 304 and 306 of the reflective projection system still remain within the bounds of the aforesaid boundary condition relationships. However, after optimization, the Strehl ratio of total aberrations has a value of at least 0.95.

By limiting the N.A. value to that specified by relationship 1 set forth above and limiting the value of the ratio of $T_{off}/R_1$ to that specified by relationship 2 set forth above, the respective widths and spatial positions of spherical-mirror segments 300, 302, 304 and 306 may be selected to insure that very little, if any, of the object-pattern light in object plane 308 (e.g., light from object point $P_{OB}$) in traveling over successive light paths 312, 314, 316, 318 and 320 to image plane 310 is blocked by the presence of an intervening one of the spherical-mirror segments (i.e., spherical-mirror segments 304 and 302).

All the aforesaid bounary-condition relationships, other than relationship 1, is specified in relative terms (not absolute terms). This permits any desired scale of absolute values of the various parameters to be employed.

For illustrative purposes, consider the following actual practical examples of an optical design for use in ablating the surface of a wafer coating in accordance with a projected beam of ultraviolet light having a wavelength of 0.248 micrometers ($\mu$m) of a mask pattern that has been demagnified in each of its two cross sectional dimensions by a factor of 5. In these actual practical examples, optional fold mirror 124 was employed for rotating by 90° the position of ablation zone 202 (FIG. 2), so that image plane 308 would lie in a horizontal plane above the plane of the paper in FIG. 3. In this case, the inner radius of annular ring field 204 is 40.0 millimeters (mm) and the the outer radius of annular ring field 204 is 46.0 mm. The final design radii of the surfaces of spherical-mirror segments 300, 302, 304 and 306 in this case provided by operation of the computer software were $R_1=430.80$ mm, $R_2=385.46$ mm, $R_3=490.29$ mm and $R_4=552.26$ mm. With a selected N.A. of 0.065, the r.m.s. wavefront error in ablation zone 202 is only about 0.04 waves at the 0.248 $\mu$m of the ultraviolet light and the maximum distortion aberration of the demagnified image of the mask pattern is only $\pm 0.4$ $\mu$m. The Strehl ratio of the total aberrations of this optical design example was greater than 0.95.

In another optical design example employing the aforesaid Code V computer software program, the final design radii of the surfaces of spherical-mirror segments 300, 302, 304 and 306 in this case provided thereby were $R_1=450.36$ mm, $R_2=408.73$ mm, $R_3=500.99$ mm and $R_4=628.95$ mm. While the Strehl ratio of the total aberrations of this other optical design example remained greater than 0.95, the maximum distortion aberration of the demagnified image of the mask pattern rose to $\pm 0.52$ $\mu$m. However, while not part of the present invention, it was found that if the axial symmetry about axis 200 of the spherical-mirror surfaces (as shown by surfaces 400, 402, 404 and 406 in FIG. 4) were broken and the respective spherical-mirror surfaces were permitted to be tilted within mechanical restraints in the plane of the paper with respect to axis 200, a 2% increase in the Strehl ratio of total aberrations with a 65% reduction in distortion aberration could be achieved so that only a maximum distortion aberration of $\pm 0.18$ $\mu$m is left. Breaking of axial symmetry is feasible because the ablation zone 202 (FIG. 2) occupies only a small given segment of the area of annular ring field 204.

Thus, while proper tilting of the spherical mirrors results in increasing the Strehl ratio of total aberrations and reducing distortion aberration within the small given segment of the area of annular ring field 204 occupied by ablation zone 202, it has the overall effect of reducing the Strehl ratio of total aberrations and increasing distortion aberration in other segments of the area of annular ring field 204 not occupied by ablation zone 202.

The two above-described examples were based on the demagnification between object plane 308 and image plane 310 having a value of 5 in each of two cross-sectional dimensions. It is apparent that if an object pattern were placed in plane 310, rather than plane 308, and an image of this pattern were obtained in plane 308, rather than plane 310, the same projection system shown in FIG. 3 would operate to magnify, rather than demagnify, the object pattern by a factor of 5 in each of two cross-sectional dimensions. In other words, the operation of the projection system shown in FIG. 3 is reciprocal between magnification and demagnification (i.e., magnification or demagnification depending solely on the relative placement positions of the object and image.

Figure 5:
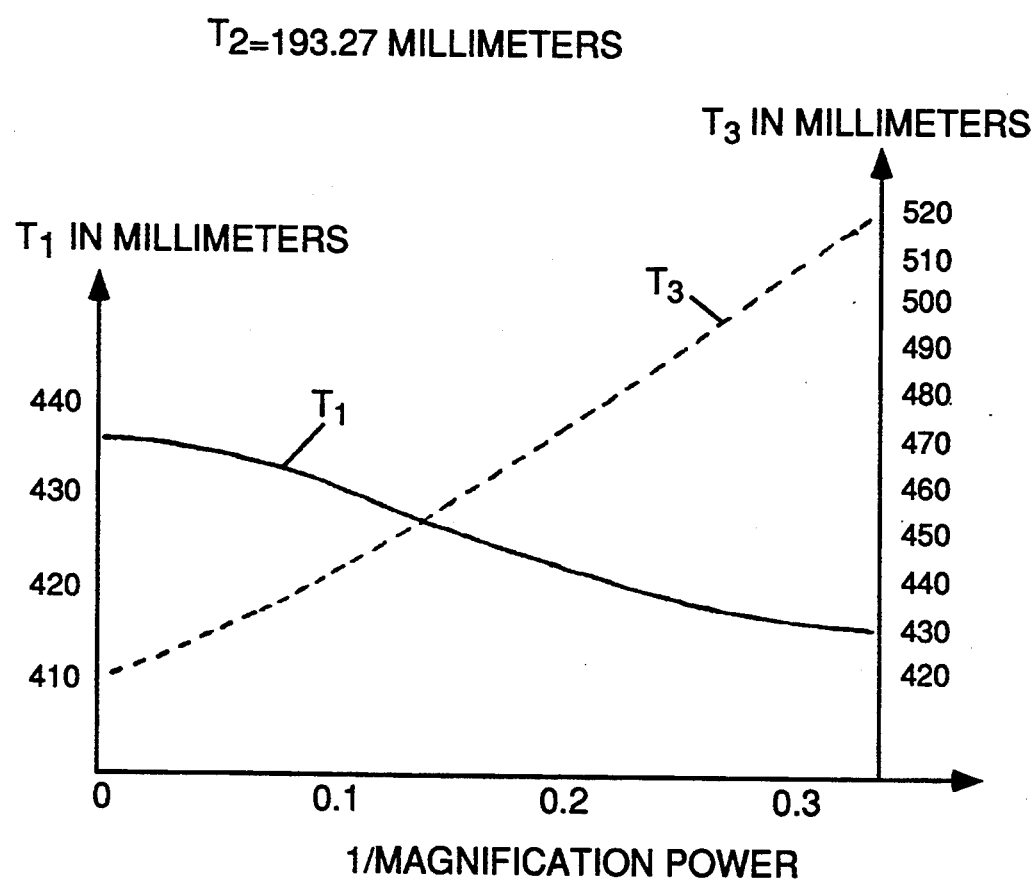
FIG. 5 is a chart exemplifying the manner in which the value of each of distances $T_1$ and $T_3$, shown in FIG. 4, varies in length as a function of the value of the reciprocal of magnification (or demagnification) for the particular case in which the length of $T_2$ has a constant value of 193.27 mm.

As discussed above, any desired magnification or demagnification value from 3 to infinity may be achieved employing the above-described optical design boundaries by specifying the desired magnification or demagnification value as an input to the computer software program. The effect of so doing changes the relative length of the axial distance $T_1$ with respect to that of axial distance $T_2$ and the relative length of the axial distance $T_3$ with respect to that of axial distance $T_2$. FIG. 5 is a chart exemplifying the manner in which the value of each of $T_1$ and $T_3$ varies in length as a function of the value of the reciprocal of magnification (or demagnification) for the particular case in which the length of $T_2$ has a constant value of 193.27 mm. Thus, for the aforesaid examples in which the value of demagnification is 5 (so that the reciprocal of demagnification is 0.2), $T_1$ is equal to about 422 mm, $T_2$ remains equal to 193.27 mm and $T_3$ is equal to about 472 mm. FIG. 5 was plotted by successively specifying each of series of different values of magnifications (or demagnifications) between infinity and 3 (i.e, reciprocals between 0 and 0.33) as an input to the computer software program, thereby deriving a series of successive point values for each of $T_1$ and $T_3$ that have been interconnected in the FIG. 5 chart.

As indicated in block 110a of FIG. 1a, a zooming mechanism, which is known in the optical design art, may be included in the reflective demagnifying optics. More specifically, it is apparent from FIG. 5 that spherical-mirror segments 302, 304 and 306 of FIG. 3 may be moveably mounted by means of such a known zooming mechanism to effect movement of these spherical-mirror segments 302, 304 and 306 with respect to spherical-mirror segment 300 and one another so that the axial distance between the surfaces of spherical-mirror segments 302 and 304 can remain fixed at $T_2$ while the axial distance $T_1$ between the surfaces of spherical-mirror segments 300 and 302 and the axial distance $T_3$ between the surfaces of spherical-mirror segments 304 and 306 are each varied to provide a continuous given range of demagnification (magnification) power values equal to part or all of the entire range between 3 and infinity, such as the range in the manner shown by the FIG. 5 chart for example.

Although the above description of the present invention has been specifically directed to a reflective projection system employing ultraviolet-light radiation of 0.248 $\mu$m, it should be understood that the principles of the present invention are applicable to a reflective projection system employing radiation at other wavelengths.

What is claimed is:

1. A reflective projection system having a given optical axis for either projecting, into a segment of an annular ring surrounding said given optical axis and lying in a first plane, a demagnified radiation image of an object pattern situated in a second plane or, alternatively, projecting, into said second plane, a magnified radiation image of an object pattern situated in said segment of an annular ring; said reflective projection system comprising:

a first spherical-mirror segment of a certain width having a concave surface radius of curvature equal in value to $R_1$, said first spherical-mirror segment being spaced a first given axial distance $T_0$ from said first given plane;

a second spherical-mirror segment of a certain width having a convex surface radius of curvature equal in value to $R_2$, said second spherical-mirror segment being spaced a second given axial distance $T_1$ from said first spherical-mirror segment;

a third spherical-mirror segment of a certain width having a concave surface radius of curvature equal in value to $R_3$, said third spherical-mirror segment being spaced a third given axial distance $T_2$ from said second spherical-mirror segment;

a fourth spherical-mirror segment of a certain width having a convex surface radius of curvature equal in value to $R_4$, said fourth spherical-mirror segment being spaced a fourth given axial distance $T_3$ from said third spherical-mirror segment;

the relative values of said respective radii of curvatures $R_1$, $R_2$, $R_3$ and $R_4$ being such that $R_2 \leq R_1 \leq R_3 \leq R_4$ and $0.95 \leq (1/R_1 + 1/R_3)/(1/R_2 + 1/R_4) \leq 1.05$;

said annular ring having a radius no greater in value than 0.2; and the respective lengths of axial distances $T_0$, $T_1$, $T_2$ and $T_3$, the respective spatial positions of said first, second, third and fourth spherical-mirror segments, and the respective certain widths of said first, second, third and fourth spherical-mirror segments being such that radiation defining an object pattern situated in said second plane is successively reflected, in order, from said fourth, third, second and first spherical-mirror segments defines an optimized image of said object pattern with a numerical aperture no greater than 0.12 in said first plane with a Strehl ratio of total aberrations at least equal in value to 0.95 which is demagnified by a specified demagnification power value between 3 and infinity, with said second and first spherical-mirror segments by themselves providing a demagnification or magnification power value between 0.8 and 1.2, and with substantially no blockage of said reflected radiation traveling over a path between said first and second planes taking place by the presence an intervening one of said spherical-mirror segments in said radiation path.

2. The reflective projection system defined in claim 1, wherein:

the value of $T_0$ is such that $0.4 \leq T_0/R_1 \leq 0.7$.

3. The reflective projection system defined in claim 1, wherein:

the value of $T_1$ is such that $0.6 \leq T_1/R_1 \leq 1.1$.

4. The reflective projection system defined in claim 1, wherein:

the value of $T_2$ is such that $0.4 \leq T_2/R_2 \leq 0.85$.

5. The reflective projection system defined in claim 1, wherein:

the value of $T_3$ is such that $0.5 \leq T_3/R_3 \leq 1.2$.

6. The reflective projection system defined in claim 1, further comprising:

a zooming mechanism coupled to said spherical-mirror segments to effect relative movement of said spherical-mirror segments with respect to one another for varying the demagnification provided by said spherical-mirror segments over a certain continuous given range of demagnification power values.

7. The reflective projection system defined in claim 6, wherein:

said certain continuous given range of demagnification power values consists of the entire range of demagnification power values between 3 and infinity.

8. The reflective projection system defined in claim 1, further comprising:

first means including a source of said radiation and an mask defining said object pattern for deriving said object pattern in said second plane; and second means including a substrate situated said said first plane having said demagnified radiation image of an object pattern incident thereon;

wherein the respective values of radiation power of said source and said demagnification power of said reflective projection system are high enough to provide said demagnified radiation image of said object pattern incident on a surface of said substrate with a radiation intensity sufficient to ablate said surface of said substrate in accordance with said demagnified radiation image of said object pattern.

9. The reflective projection system defined in claim 8, wherein:

said substrate comprises a coated wafer; and said surface of said substrate that is ablated comprises a coating surface of said coated wafer.

10. The reflective projection system defined in claim 8, wherein:

said source of said radiation is an excimer laser that emits ultraviolet radiation having at least one of wavelengths 0.196 $\mu$m, 0.248 $\mu$m and 0.308 $\mu$m.

11. The reflective projection system defined in claim 10, wherein:

the radiation power of said excimer laser is at least 100 watts.

12. The reflective projection system defined in claim 10, wherein:

said demagnification power is 5.

13. The reflective projection system defined in claim 1, wherein:

said demagnification power is 5.

14. The reflective projection system defined in claim 1, further comprising:

a fold mirror situated in said reflected radiation path between said first spherical-mirror segment and said first plane for rotating the position of said first plane by 90°.

* * * * *